(12) United States Patent
Lee et al.

(10) Patent No.: US 9,224,727 B2
(45) Date of Patent: Dec. 29, 2015

(54) ESD PROTECTION APPARATUS

(71) Applicant: Taiwan Semiconductor Manufacturing Company, Ltd., Hsin-Chu (TW)

(72) Inventors: Jam-Wem Lee, Zhubei (TW); Yi-Feng Chang, Xinbei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/476,486

(22) Filed: Sep. 3, 2014

(65) Prior Publication Data
US 2014/0367829 A1 Dec. 18, 2014

Related U.S. Application Data

(62) Division of application No. 13/246,672, filed on Sep. 27, 2011, now Pat. No. 8,853,825.

(51) Int. Cl.
*H01L 27/082* (2006.01)
*H01L 27/02* (2006.01)
*H01L 29/732* (2006.01)
*H01L 29/735* (2006.01)
*H01L 29/06* (2006.01)

(52) U.S. Cl.
CPC .......... *H01L 27/0259* (2013.01); *H01L 29/732* (2013.01); *H01L 29/735* (2013.01); *H01L 29/0649* (2013.01)

(58) Field of Classification Search
CPC ...................................................... H01L 27/082
USPC ......................................... 257/557, 173, 591
See application file for complete search history.

(56) References Cited

U.S. PATENT DOCUMENTS

| | | | |
|---|---|---|---|
| 6,084,272 A | 7/2000 | Jung | |
| 8,390,096 B2 | 3/2013 | Hwang et al. | |
| 2004/0022211 A1 | 2/2004 | Conti | |
| 2005/0167753 A1 | 8/2005 | Mallikarjunaswamy et al. | |
| 2006/0278930 A1 | 12/2006 | Huang | |
| 2007/0170907 A1 | 7/2007 | Ito et al. | |
| 2008/0142899 A1 | 6/2008 | Morris et al. | |
| 2009/0244928 A1 | 10/2009 | Yang et al. | |
| 2010/0103570 A1* | 4/2010 | Song et al. | 361/56 |
| 2010/0200947 A1 | 8/2010 | Hung et al. | |
| 2010/0267212 A1 | 10/2010 | Morris | |
| 2013/0027114 A1* | 1/2013 | Petruzzi et al. | 327/437 |

* cited by examiner

*Primary Examiner* — Marc Armand
(74) *Attorney, Agent, or Firm* — Haynes and Boone, LLP

(57) ABSTRACT

An ESD protection apparatus comprises an n-type substrate with a first doping density, a low voltage n-type well in the substrate, a low voltage p-type well in the substrate, a first n-type semiconductor region over the low voltage n-type well and a second n-type semiconductor region over the low voltage p-type well, wherein the first semiconductor region and the second semiconductor region are separated by a first isolation region.

20 Claims, 5 Drawing Sheets

ESD PROTECTION APPARATUS

This is a divisional of U.S. Pat. No. 8,853,825, entitled "ESD Protection Apparatus," filed on Sep. 27, 2011, which is incorporated herein by reference.

BACKGROUND

Electrostatic discharge (ESD) is a rapid discharge that flows between two objects due to the built-up of static charge. ESD may destroy semiconductor devices because the rapid discharge can produce a relatively large current. In order to reduce the semiconductor failures due to ESD, ESD protection circuits have been developed to provide a current discharge path. When an ESD event occurs, the discharge current is conducted through the discharge path without going through the internal circuits to be protected.

In the semiconductor technology, ESD protection solutions such as NMOS transistors, Silicon-Controlled Rectifiers (SCRs) and RC triggered PMOS transistors are widely used. Each ESD protection device may comprise a detection circuit and an ESD current discharge path. For example, an RC triggered ESD protection circuit may comprise a discharge transistor, a driver and an ESD spike detection circuit. The ESD spike detection circuit may include a resistance element and a capacitance element connected in series to form an RC detection circuit. The node between the resistance element and the capacitance element is coupled to the gate of the discharge transistor via the driver. The time constant formed by the resistance element and the capacitance element is so chosen that the discharge transistor is turned off when the ESD protection device operates in a normal power up mode. On the other hand, the discharge transistor is turned on when an ESD spike occurs at a power bus to which the ESD protection circuit is coupled. The turn-on of the discharge transistor may provide a bypass of the ESD current from the power bus to ground so as to clamp the voltage of the power bus to a level below the maximum rating voltage to which the internal circuit is specified, so that it helps to prevent the large voltage spike from damaging the internal circuits being protected.

Similarly, a PNP transistor can be used as an ESD protection device. More particularly, the emitter of the PNP transistor is coupled to an input/output (I/O) pad of an integrated circuit and the collector of the PNP transistor is coupled to ground. When an ESD event occurs, an external voltage across the I/O pad and ground increases beyond the reverse-bias breakdown voltage of the PNP transistor. As a result, a conductive path is established between the emitter and the collector of the PNP transistor. Such a conductive path allows the large amount of ESD energy to be discharged in a relatively short amount of time. As a consequence, the internal circuit components of the integrated circuit can be protected from being damaged by the ESD event.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a PNP transistor based electrostatic discharge (ESD) protection device. The invention may also be applied, however, to a variety of ESD protection devices.

Figure 1:
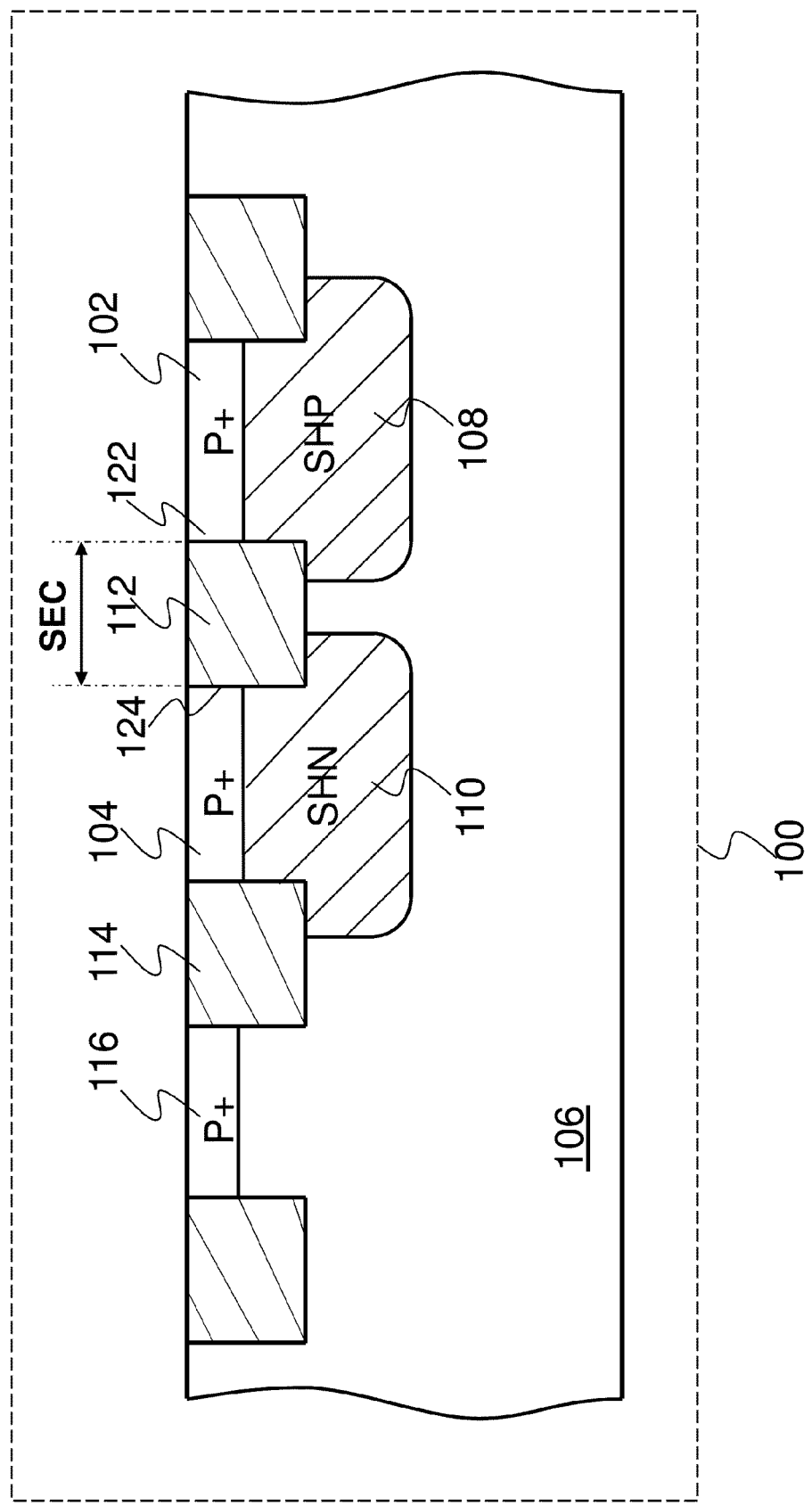
FIG. 1 illustrates a simplified cross-sectional view of an Electrostatic discharge (ESD) protection structure 100 in accordance with an embodiment.

FIG. 1 illustrates a simplified cross-sectional view of an ESD protection structure 100 in accordance with an embodiment. The ESD protection structure 100 includes a first P+ region 102, a second P+ region 104, a third P+ region 116, a first isolation region 112, a second isolation region 114, a shallow p-type well 108 and a shallow n-type well 110. For simplicity, throughout the description, the shallow low voltage p-type well 108 and the shallow low voltage n-type well 110 are alternatively referred to as a SHP region 108 and a SHN region 110 respectively. In accordance with an embodiment, the SHP region 108 and the SHN region 110 have a depth of from 0.1 µm to 0.5 µm.

The SHP region 108 and the SHN region 110 are formed on a substrate 106. The first P+ region 102 and the second P+ region 104 are disposed on the SHP region 108 and the SHN region 110 respectively. It should be noted that both the SHP region 108 and the SHN region 110 are fabricated in a low voltage CMOS process. In accordance with an embodiment, both the SHP region 108 and the SHN region 110 are fabricated in a 5V CMOS process. It should further be noted that while the SHN region 110 and the SHP region 108 appear to be similar in FIG. 1, one person skilled in the art will recognize that it is merely an example. The SHN region 110 and the SHP region 108 may have unequal dimensions or doping concentrations.

In accordance with an embodiment, the first P+ region 102, the second P+ region 104 and the third P+ region 116 are highly doped. The first P+ region 102, the second P+ region 104 and the third P+ region 116 have a doping density of between about $10^{20}/cm^3$ and $10^{21}/cm^3$. In addition, both the SHP region 108 and the SHN region 110 are heavily doped regions. The SHP region 108 has a doping density of between about $10^{17}/cm^3$ and $10^{18}/cm^3$. The SHN region 110 has a doping density of between about $10^{17}/cm^3$ and $10^{18}/cm^3$. On the other hand, the substrate 106 may be a lightly doped region. The substrate 106 has a doping density of $10^{15}/cm^3$.

It should be noted that the doping technique used in the previous example is selected purely for demonstration purposes and is not intended to limit the various embodiments to any particular doping technique. One skilled in the art will recognize that alternate embodiment could be employed (such as employing the diffusion technique).

The first isolation region 112 and the second isolation region 114 are used to isolate active regions so as to prevent leakage current from flowing between adjacent active regions. The isolation region (e.g., isolation region 112) can be formed by various ways (e.g., thermally grown, deposited) and materials (e.g., silicon oxide, silicon nitride). In this embodiment, the first isolation region 112 and the second isolation region 114 may be fabricated by a shallow trench isolation (STI) technique.

As shown in FIG. 1, the first P+ region 102 is separated from the second P+ region 104 by the first isolation region 112. Likewise, the upper portion of the SHP region 108 and the upper portion of the SHN region 110 are separated by the first isolation region 112. As shown in FIG. 1, the bottom portion of the SHP region 108 is separated from the bottom portion of the SHN region 110 by the substrate 106. The distance between the first P+ region 102 and the second P+ region 104 is designated SEC.

One skilled in the art will recognize that FIG. 1 illustrates an ideal profile as doped. The distance SEC may vary after subsequent diffusion processes. The distance SEC shown in FIG. 1 is used to illustrate the inventive aspects of the various embodiments. The present invention is not limited to any particular distance between two P+ regions.

In accordance with an embodiment, SEC is an adjustable parameter. As shown in FIG. 1, SEC represents the distance between two P+ regions, namely the first P+ region 102 and the second P+ region 104. More particularly, as shown in FIG. 1, SEC is the distance from an edge 122 of the first P+ region 102 to an edge 124 of the second P+ region 104. As discussed below with respect to FIG. 3, by employing different SEC values, the ESD protection device 100 can achieve a tunable breakdown voltage during an ESD event. Furthermore, by adjusting the value of SEC, the ESD protection device 10 may further adjust other electrical parameters such as the trigger voltage, the holding voltage and the ESD current rating of the ESD protection device 100.

In FIG. 1, the ESD protection structure 100 provides an on-chip ESD protection solution. For ESD protection applications, the second P+ region 104 is typically coupled to an input/output (I/O) pad and the first P+ region 102 is typically coupled to a power supple VSS pad, which is typically grounded or coupled to a power supply. An advantageous feature of the described embodiment is that the adjustable breakdown voltage of an ESD protection device allows different voltage ESD protection schemes derived from the same structure as illustrated in FIG. 1.

It should be noted that while FIG. 1 illustrates an ESD protection device based upon a PNP transistor, the cross sectional view shown in FIG. 1 is merely an example, which should not unduly limit the scope of the claims. One of ordinary skill in the art would recognize many variations, alternatives, and modifications. For example, each p-type region in FIG. 1 can be replaced by its corresponding n-type region. Likewise, each n-type region shown in FIG. 1 can be replaced by its corresponding p-type region. As a result, an ESD protection device based upon an NPN transistor is formed.

Figure 2:
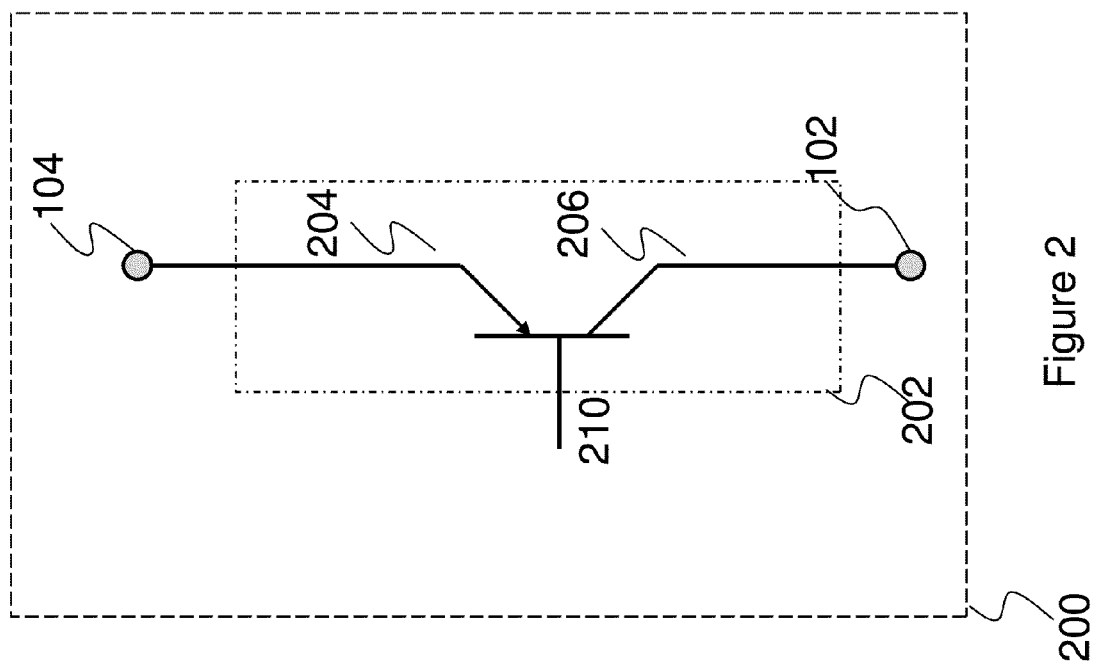
FIG. 2 illustrates an equivalent circuit diagram of the ESD protection structure illustrated in FIG. 1.

FIG. 2 illustrates an equivalent circuit diagram of the ESD protection structure 100 illustrated in FIG. 1. An equivalent circuit 200 of the ESD protection structure 100 illustrated in FIG. 1 includes a bipolar PNP transistor 202 having an emitter 204, a base 210 and a collector 206. The emitter 204 is formed by the second P+ region 104. The base 210 is formed by the SHN region 110. Furthermore, the base 210 may be coupled to the emitter 204. Alternatively, the base 210 may be floating.

The collector 206 is formed by the substrate 106, the SHP region 108 and the first P+ region 102. Referring again to FIG. 1, the first P+ region 102, the SHP region 108 and the substrate 106 have the same conductivity type but different doping concentrations. The substrate 106 as well as the SHP region 108 extends the first P+ region 102 to a wider region. Such a wider region allows the collector 206 to have a low resistance. As a result, the efficiency of the ESD protection structure 100 can be improved. Furthermore, the SHP region 108 extends the depletion region between the collector 206 and the base 210 of the PNP transistor 202 to a lower level relative to the substrate 106. As a result, the PNP transistor 202 may be of a higher breakdown voltage.

In sum, a simplified circuit diagram 200 depicts that the corresponding circuit of the ESD protection structure 100 constitutes a PNP transistor (e.g., 202), wherein its emitter is formed by a P+ region (e.g. the second P+ region 104) and its collector is formed by a combination of a P+ region, a SHP region and a portion of the substrate. However, it should be recognized that while FIG. 2 illustrates the ESD protection circuit 200 with one PNP transistor (e.g., PNP transistor 202), the ESD protection circuit could accommodate any numbers of PNP transistors. Furthermore, it is understood that the ESD protection circuit may be implemented using a plurality of PNP transistors in series connection. On the other hand, other configurations of a plurality of PNP transistors such as parallel-connected PNP transistors coupled to parallel-connected PNP transistors are also within the contemplated scope of this embodiment.

Figure 3:
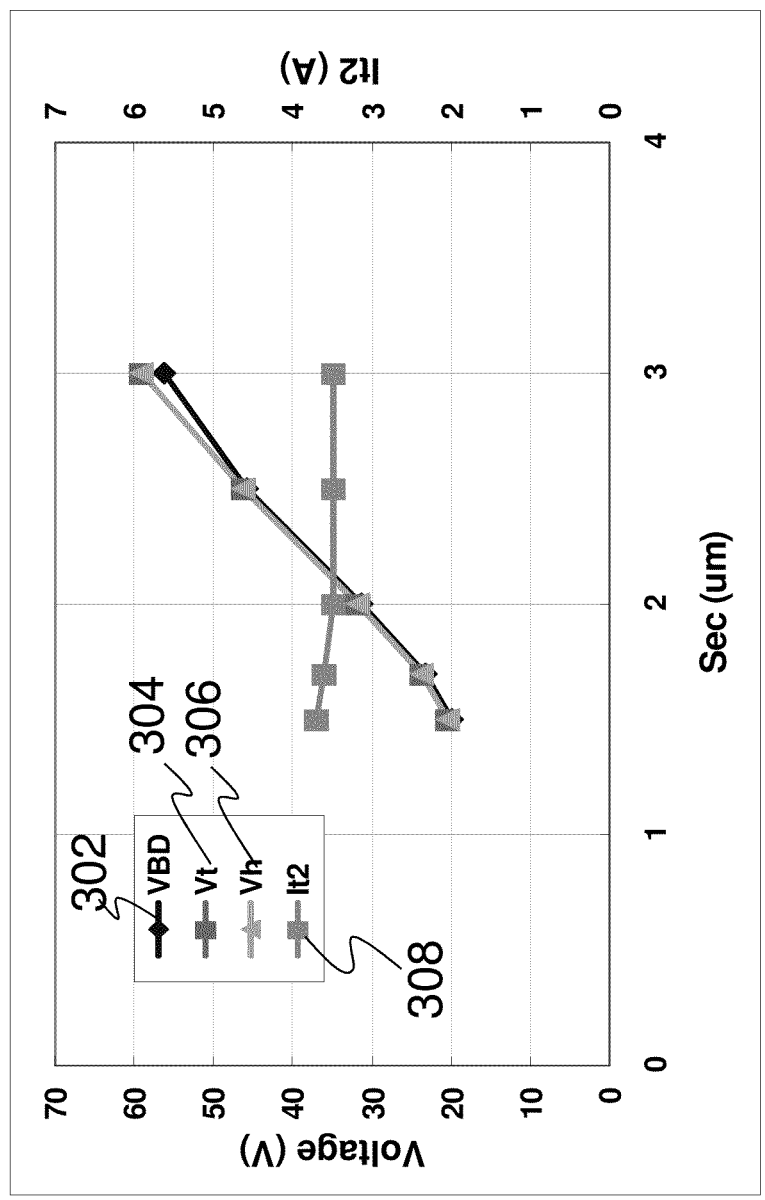
FIG. 3 illustrates four curves illustrating some performance indexes of the ESD protection circuit 200 with different SEC values.
Figure 4:
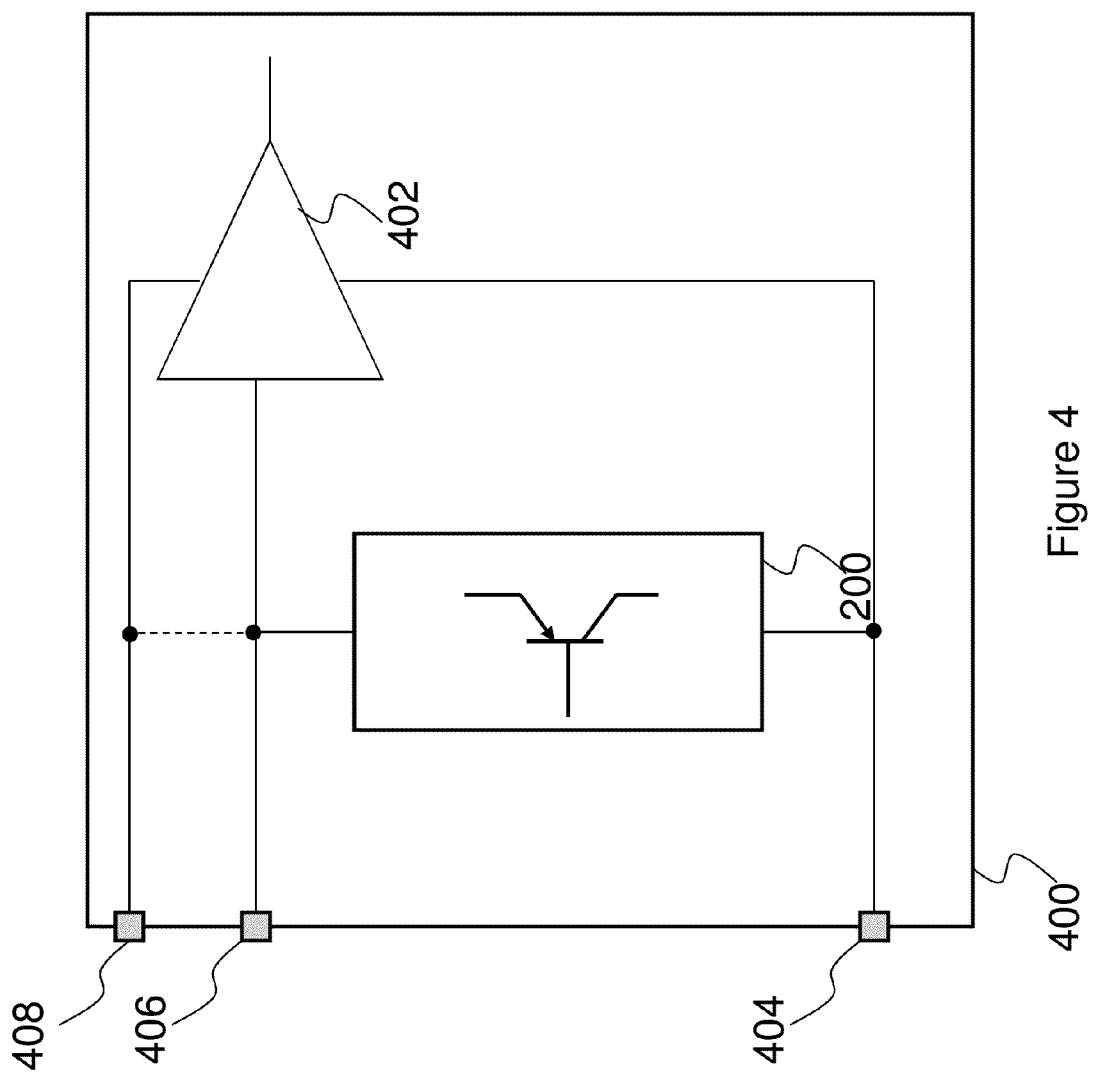
FIG. 4 illustrates an integrated circuit level ESD protection diagram in accordance with an embodiment.

The ESD protection circuit 200 is typically placed at an I/O pad and a VSS of a device to be protected (not shown but illustrated in FIG. 3 and FIG. 4). More particularly, the second P+ region 104 is typically coupled to the I/O pad and the first P+ region 102 is typically coupled to the VSS, which is typically grounded or coupled to a power supply. If an ESD event occurs, a voltage spike is applied between the second P+ region 104 and the first P+ region 102. Consequently, the PNP transistor 202 experiences the voltage spike, which may exceed the PNP transistor 202's breakdown voltage. As a result, the PNP transistor 202 enters an avalanche conduction mode. As a consequence of the avalanche conduction, the PNP transistor 202 provides a current path so that the ESD discharge current can flow from the emitter 204 to the collector 206. The conduction of the PNP transistor 202 clamps the voltage between the emitter 204 and the collector 206 to a lower level so that the internal circuits coupled to the emitter 204 can be protected.

FIG. 3 shows four curves illustrating some performance indexes of the ESD protection circuit 200 with different SEC values. The horizontal axis of FIG. 3 represents the SEC value of an ESD protection circuit (e.g., the ESD protection circuit 200). The first vertical axis of FIG. 3 represents the ESD voltage applied to the ESD protection device. The second vertical axis of FIG. 3 represents the ESD current flowing through the ESD protection circuit 200.

In an ESD protection device, the trigger voltage of the ESD protection device is defined as a peak voltage when the ESD protection device transitions from high resistance to low resistance. Once the trigger voltage of the ESD protection device is reached, the ESD protection device starts to conduct the ESD current. As a result, the voltage across the ESD protection device falls back to a holding voltage. The breakdown voltage of the ESD protection device is the voltage across the ESD protection device when the ESD protection device starts to conduct a large current.

In FIG. 3, a curve 302, a curve 304 and a curve 306 illustrate the break down voltage, the trigger voltage and the holding voltage of the ESD protection circuit 200 respectively. In addition, curves 302, 304 and 306 depict the voltage variations when the ESD protection circuit 200 has different SEC values (e.g., SEC varies from 1.5 um to 3 um). Moreover, the curve 308 illustrates the ESD current variations of the ESD protection circuit 200 under different SEC values.

As shown in FIG. 3, curves 302, 304 and 306 indicate that the ESD protection device has a tunable ESD protection range from 20V to 60V by employing different SEC values. In addition, the breakdown voltage, the trigger voltage and the holding voltage of the ESD protection device are quite similar under the same SEC value. For example, when SEC is equal to 2 um, the breakdown voltage, the trigger voltage and the holding voltage of the ESD protection device is approximately equal to 30V. There may be a slight difference when a larger SEC value is employed. As shown in FIG. 3, when SEC is equal to 3 um, the breakdown voltage is approximately 3V less than the trigger voltage and 2V less than the holding voltage. One advantageous feature of having the tunable ESD protection device is that the ESD protection device provides reliable trigger points and breakdown voltages at different SEC values.

A curve 308 shows the ESD current variations under different SEC values. The curve 308 indicates that the ESD currents under different SEC values are quite similar. In accordance with an embodiment, the ESD current is approximately 3.5 A. When the SEC value is from 2 um to 3 um, the ESD current variation is minimal. In contrast, when the SEC value changes from 2 um to 1.5 um, the ESD current may increase slightly. As shown in FIG. 3, the ESD current may increase by about 0.25 A through reducing the SEC value from 2 um to 1.5 um. One advantageous feature of having a tunable ESD protection device is that the ESD current can be adjusted by employing different SEC values. More particularly, form some low voltage rating applications (e.g., 20V), a small SEC value (e.g., 1.5 um) may be selected so that a corresponding high ESD current may be achieved.

FIG. 3 shows an ESD protection device based upon the ESD protection structure 100 can have different breakdown voltages as well as trigger and holding voltages by selecting different values of SEC. An increase of SEC results in a proportional increase of the corresponding breakdown voltage. As such, an advantageous feature of this embodiment is that semiconductor devices having different voltage ratings (e.g., 20V, 30V, 40V) may be fabricated based upon the same basic structure by selecting different values of SEC.

FIG. 4 illustrates an integrated circuit level ESD protection diagram in accordance with an embodiment. An integrated circuit chip 400 has a VDD pad 408, an I/O pad 406 and a VSS pad 404. Internal circuits 402 are coupled to the VDD pad 408 and VSS pad 404. The internal circuits 402 further include an input coupled to the I/O pad 406. The ESD protection circuit 200 is coupled between the I/O pad 406 and the VSS pad 404. It should be noted that the ESD protection circuit 200 is provided for illustrative purpose only. The ESD protection circuit between the I/O pad 406 and the VSS pad 404 may comprise any variations of the ESD protection circuits 200 shown in FIG. 2.

When an ESD event occurs between the I/O pad 406 and the VSS pad 404, the ESD protection circuit 200 conducts the ESD current, and the turn-on of an ESD protection circuit (e.g., the ESD protection circuit 200) clamps the voltage between the I/O pad 406 and the VSS pad 404 below the maximum voltage to which the internal circuits 402 are specified, so that the internal circuits 402 coupled between the I/O pad 406 and the VSS pad 404 are protected. An advantageous feature of the described circuit level ESD protection is the ESD protection circuit provides a bypass for ESD current to flow so that the various circuit components of the internal circuit 402 are protected.

It should be noted that the ESD protection circuit 200 may be coupled between the VDD pad 408 and the VSS pad 404 as indicated by the dashed line in FIG. 4. When an ESD event occurs between the VDD pad 408 and the VSS pad 404, the conduction of the ESD protection circuit clamps the voltage between the VDD pad 408 and the VSS pad 404, so that the internal circuits such as internal circuits 402 are protected. In short, the connection of the ESD device 200 in FIG. 4 is merely an example, which should not unduly limit the scope of the claims. One skilled in the art will recognize many variations, alternatives, and modifications. For example, the ESD protection circuit 200 may comprise a plurality of PNP transistors connected in series.

Figure 5:
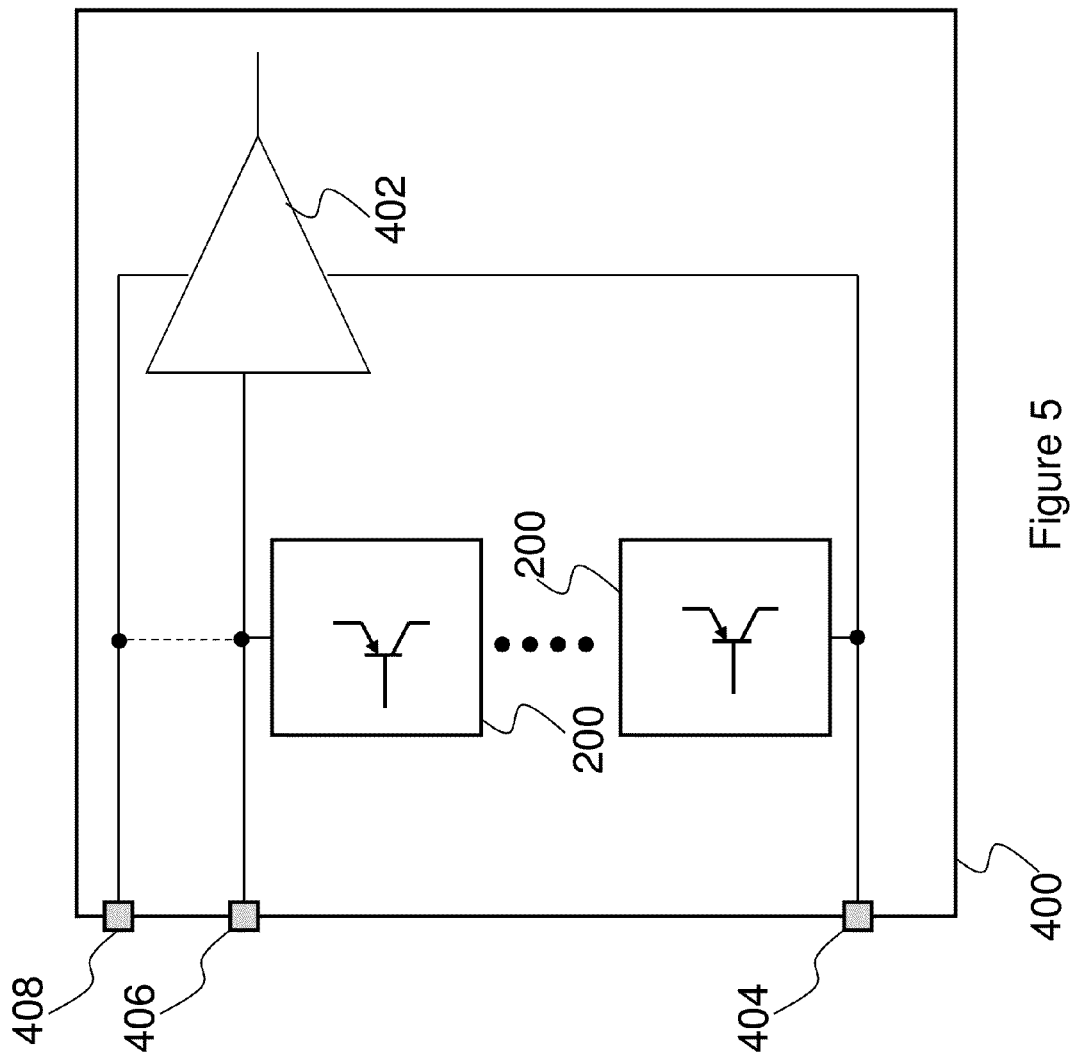
FIG. 5 illustrates a further ESD protection scheme by employing a plurality of ESD protection circuits in series connection between an input/output (I/O) pad and a VSS pad.

FIG. 5 illustrates a further ESD protection scheme by employing a plurality of ESD protection circuits in series connection between an I/O pad and a VSS pad. Similar to FIG. 4, FIG. 5 includes an integrated circuit 400, a VDD pad 408, an I/O pad 406, a VSS pad 404 and internal circuits 402. However, FIG. 5 further includes a series connection of ESD protection circuits electrically coupled to the I/O pad 406 and the VSS pad 404. In high voltage applications, a single ESD protection circuit such as the ESD protection circuit 200 shown in FIG. 4 may not provide a reliable ESD protection. By contrast, a plurality of ESD protection circuits 200 connected in series may provide an adjustable ESD protection breakdown voltage as well as an adjustable ESD protection current. As shown in FIG. 5, the ESD protection circuits 200 connected in series are substantially identical. It should be noted that "substantially identical" means the same design but could be different from each other due to fabrication process variations In FIG. 5, if an ESD event occurs, a voltage spike is applied between the I/O pad 406 and the VSS pad 404. The series-connected ESD protection circuits may turn on nearly simultaneously. Each ESD protection circuit provides an ESD protection breakdown voltage. The sum of all series-connected ESD protection circuits' breakdown voltages clamps the I/O pad's voltage 406 to a level below the maximum rating voltage of the internal circuits 402, so that the internal circuits 402 are protected.

As described above with respect to FIG. 4, placing an ESD device (e.g., ESD protection device 200) between the I/O pad 406 and the VSS pad 404 in FIG. 5 is merely an example. One skilled in the art will recognize many variations, alternatives, and modifications, such as connecting the ESD device between the VDD pad 408 and the VSS pad 404 as indicated by the dashed line in FIG. 5.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus comprising:
   an n-type substrate with a first doping density;
   a low voltage n-type well in the substrate;
   a low voltage p-type well in the substrate;
   a first n-type semiconductor region over the low voltage n-type well; and
   a second n-type semiconductor region over the low voltage p-type well, wherein the first semiconductor region and the second semiconductor region are separated by a first isolation region, and wherein the first isolation region has a first edge contacting the first n-type semiconductor region and a second edge contacting the second n-type semiconductor region.

2. The apparatus of claim 1, wherein:
   a doping density of the low voltage p-type well is equal to a doping density of the low voltage n-type well.

3. The apparatus of claim 2, wherein:
   the doping density of the low voltage p-type well and the doping density of the low voltage n-type well are substantially higher than the first doping density.

4. The apparatus of claim 1, wherein:
   a doping density of the second n-type semiconductor region is equal to a doping density of the first n-type semiconductor region.

5. The apparatus of claim 4, wherein:
   the doping density of the second n-type semiconductor region and the doping density of the first n-type semiconductor region are substantially higher than the first doping density.

6. The apparatus of claim 1, wherein:
   the second n-type semiconductor region, the first n-type semiconductor region, the low voltage n-type well and the low voltage p-type well form an NPN transistor.

7. The apparatus of claim 6, wherein:
   a breakdown voltage of the NPN transistor is tunable by adjusting a length of the first isolation region.

8. The apparatus of claim 6, wherein:
   the first n-type semiconductor region is a first N+ region; and
   the second n-type semiconductor region is a second N+ region.

9. The apparatus of claim 8, wherein:
   the second N+ region forms an emitter of the NPN transistor.

10. The apparatus of claim 8, wherein:
    the low voltage p-type well forms a base of the NPN transistor.

11. The apparatus of claim 8, wherein:
    the first N+ region, the low voltage n-type well form a collector of the NPN transistor.

12. A circuit comprising:
    a first NPN transistor comprising
    a first collector formed by a first N+ region, a low voltage n-type well and a substrate;
    a first emitter formed by a second N+ region, wherein the first N+ region and the second N+ region are separated by a first isolation region having a first edge contacting the first N+ region and a second edge contacting the second N+ region; and
    a first base formed by a low voltage p-type well, wherein the low voltage p-type well is between the substrate and the second N+ region;
    a first pad coupled to the first emitter of the first NPN transistor; and
    a second pad coupled to the first collector of the first NPN transistor.

13. The circuit of claim 12, further comprising a second NPN transistor comprising:
    a second collector;
    a second emitter; and
    a second base, wherein the second NPN transistor has a substantially identical structure as the first NPN transistor.

14. The circuit of claim 13, wherein:
    the second NPN transistor and the first NPN transistor are connected in series and coupled between the first pad and the second pad.

15. The circuit of claim 13, wherein:
    the first base of the first NPN transistor is coupled to the first emitter of the first NPN transistor; and
    the second base of the second NPN transistor is coupled to the second emitter of the second NPN transistor.

16. The circuit of claim 12, wherein:
    the second pad is tied to ground; and
    the first pad is an input/output pad.

17. The circuit of claim 12, wherein a breakdown voltage of the first NPN transistor is adjustable by changing a length of the first isolation region.

18. A circuit comprising:
    a first NPN transistor comprising:
    a first collector formed by a first N+ region, a low voltage n-type well and a substrate;
    a first emitter formed by a second N+ region, wherein the first N+ region and the second N+ region are separated by a first isolation region having a first edge contacting the first N+ region and a second edge contacting the second N+ region; and
    a first base formed by a low voltage p-type well, wherein the low voltage p-type well is formed between the substrate and the second N+ region; and
    a second NPN transistor having a substantially identical structure as the first NPN transistor, wherein the first NPN transistor and the second NPN transistor are connected in series between a first pad and a second pad.

19. The circuit of claim 18, wherein:
    the second pad is tied to ground; and
    the first pad is an input/output pad.

20. The circuit of claim 18, wherein:
    a breakdown voltage of the first NPN transistor is adjustable by changing a length of the first isolation region.

* * * * *